(12) United States Patent
Guenther et al.

(10) Patent No.: US 9,537,070 B2
(45) Date of Patent: Jan. 3, 2017

(54) OPTOELECTRONIC COMPONENT WITH A WIRELESS CONTACTING

(75) Inventors: Ewald Karl Michael Guenther, Regenstauf (DE); Jörg Erich Sorg, Regensburg (DE); Norbert Stath, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 1222 days.

(21) Appl. No.: 11/664,304

(22) PCT Filed: Sep. 13, 2005

(86) PCT No.: PCT/DE2005/001603
§ 371 (c)(1),
(2), (4) Date: Jan. 9, 2009

(87) PCT Pub. No.: WO2006/034671
PCT Pub. Date: Apr. 6, 2006

(65) Prior Publication Data
US 2009/0127573 A1 May 21, 2009

(30) Foreign Application Priority Data

Sep. 30, 2004 (DE) .................. 10 2004 047 680
Oct. 15, 2004 (DE) .................. 10 2004 050 371

(51) Int. Cl.
*H01L 27/15* (2006.01)
*H01L 33/62* (2010.01)
(Continued)

(52) U.S. Cl.
CPC .............. *H01L 33/62* (2013.01); *H01L 24/24* (2013.01); *H01L 24/82* (2013.01); *H01L 33/52* (2013.01);
(Continued)

(58) Field of Classification Search
CPC ................ H01L 2924/014; H01L 2924/01033; H01L 2924/01023; H01L 2924/01082; H01L 2924/01051; H01L 2924/351; H01L 2924/12036; H01L 2924/00; H01L 2924/12042; H01L 33/62; H01L 33/52; H01L 33/54; H01L 33/508
(Continued)

(56) References Cited

U.S. PATENT DOCUMENTS 4,622,056 A   11/1986 Matsuo et al.
4,936,808 A   6/1990  Lee et al.
(Continued)

FOREIGN PATENT DOCUMENTS

CN   1409411    4/2003
CN   1487605    4/2004
(Continued)

OTHER PUBLICATIONS

Margalith et al., "Indium tin oxide contacts to gallium nitride optoelectronic devices", Applied Physics Letters, American Institute of Physics, vol. 74, No. 26, pp. 3930-3932, Jun. 28, 1999.
(Continued)

*Primary Examiner* — Hoa B Trinh
(74) *Attorney, Agent, or Firm* — Cozen O'Connor

(57) ABSTRACT

An optoelectronic component contains a semiconductor chip (1) and a carrier body (10), which are provided with a transparent, electrically insulating encapsulation layer (3), the encapsulation layer (3) having two cutouts (11, 12) for uncovering a contact area (6) and a connection region (8) of the carrier body, and an electrically conductive layer (14) being led from the contact area (6) over a partial region of the encapsulation layer (3) to the electrical connection region (8) of the carrier body (10) in order to electrically connect the contact area (6) and the electrical connection
(Continued)

region (8) to one another. The radiation emitted in a main radiation direction (13) by the semiconductor chip (1) is coupled out through the encapsulation layer (3), which advantageously contains luminescence conversion substances for the wavelength conversion of the emitted radiation.

14 Claims, 6 Drawing Sheets

(51) Int. Cl.
*H01L 23/00* (2006.01)
*H01L 33/52* (2010.01)
*H01L 33/54* (2010.01)
*H01L 33/50* (2010.01)

(52) U.S. Cl.
CPC ............. *H01L 33/54* (2013.01); *H01L 33/508* (2013.01); *H01L 2224/24051* (2013.01); *H01L 2224/24105* (2013.01); *H01L 2224/24226* (2013.01); *H01L 2224/24998* (2013.01); *H01L 2224/82007* (2013.01); *H01L 2224/82039* (2013.01); *H01L 2924/014* (2013.01); *H01L 2924/01005* (2013.01); *H01L 2924/01006* (2013.01); *H01L 2924/01013* (2013.01); *H01L 2924/01023* (2013.01); *H01L 2924/01033* (2013.01); *H01L 2924/01049* (2013.01); *H01L 2924/01051* (2013.01); *H01L 2924/01058* (2013.01); *H01L 2924/01082* (2013.01); *H01L 2924/12036* (2013.01); *H01L 2924/12041* (2013.01); *H01L 2924/12042* (2013.01); *H01L 2924/351* (2013.01)

(58) Field of Classification Search
USPC ............................. 257/79, 98, 749, E33.055, E33.067, 257/E33.073, E33.059, E33.064, E25.032, 99, 257/100, E21.502, E33.061; 445/25; 313/512; 438/28
See application file for complete search history.

(56) References Cited

U.S. PATENT DOCUMENTS

| | | | |
|---|---|---|---|
| 5,246,767 A | 9/1993 | Agou et al. | |
| 5,538,919 A | 7/1996 | Lebby et al. | |
| 6,066,861 A | 5/2000 | Höhn et al. | |
| 6,498,356 B1 | 12/2002 | Sekiya et al. | |
| 6,531,328 B1* | 3/2003 | Chen | 438/26 |
| 7,078,737 B2 | 7/2006 | Yuri et al. | |
| 2002/0057057 A1* | 5/2002 | Sorg | 313/512 |
| 2002/0070449 A1 | 6/2002 | Yagi et al. | |
| 2003/0080341 A1* | 5/2003 | Sakano et al. | 257/79 |
| 2003/0095224 A1* | 5/2003 | Asakura et al. | 349/143 |
| 2004/0041159 A1* | 3/2004 | Yuri et al. | 257/79 |
| 2005/0121765 A1* | 6/2005 | Lin | 257/686 |
| 2007/0008734 A1 | 1/2007 | Bogner et al. | |

FOREIGN PATENT DOCUMENTS

| | | |
|---|---|---|
| DE | 196 38 667 A1 | 4/1998 |
| EP | 1 434 271 A2 | 12/2003 |
| JP | 02-158734 | 6/1990 |
| JP | 03017656 | 2/1991 |
| JP | 9-283801 | 10/1997 |
| JP | 10-288701 | 10/1998 |
| JP | 11087778 | 3/1999 |
| JP | 11191642 | 7/1999 |
| JP | 2001-102626 | 4/2001 |
| JP | 2001-526798 | 12/2001 |
| JP | 2002-203989 A | 7/2002 |
| JP | 2004-221186 | 8/2004 |
| WO | WO 98/12757 | 3/1998 |
| WO | WO 98/45113 | 10/1998 |
| WO | WO 02/065558 A | 8/2002 |
| WO | WO 2004/082036 | 9/2004 |
| WO | WO 2004/088200 | 10/2004 |

OTHER PUBLICATIONS

Written Opinion dated Apr. 3, 2007 issued for the underlying International Application No. PCT/DE2005/001603.

English Translation of Japanese Examination Report dated Jun. 13, 2011.

Van Derlofske, J. F. et al., "White LED Sources for Vehicle Forward Lighting", Solid State Lighting II: Proceedings of SPIE (2002).

\* cited by examiner

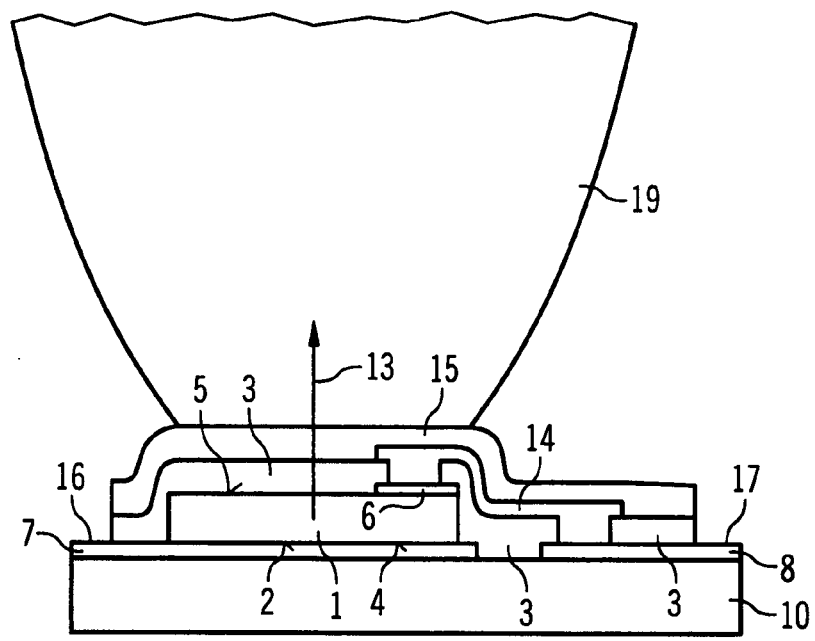
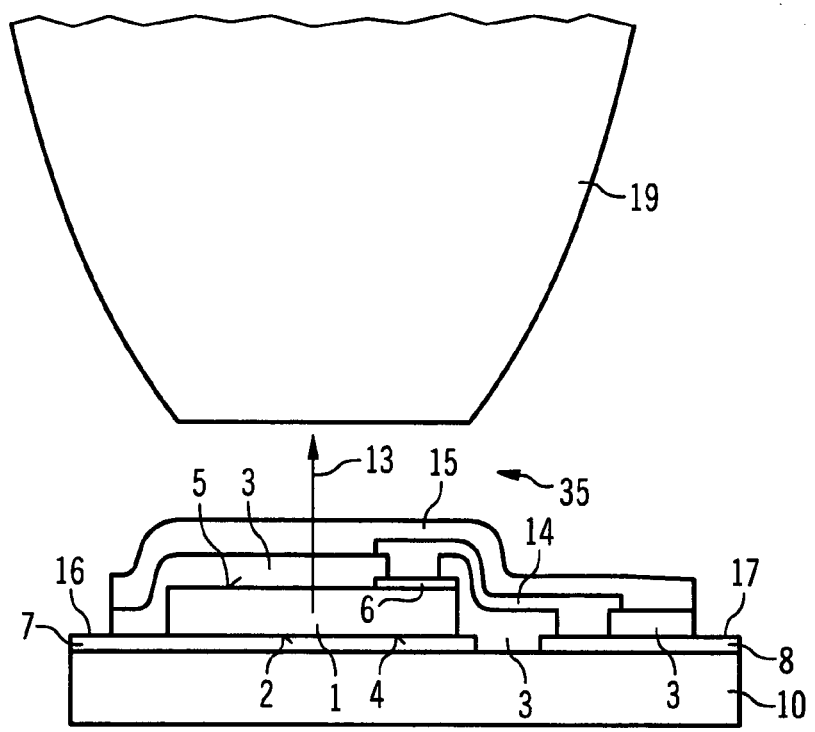

OPTOELECTRONIC COMPONENT WITH A WIRELESS CONTACTING

RELATED APPLICATIONS

This is a U.S. national stage of application No. PCT/DE2005/001603 filed on Sep. 13, 2005.

This patent application claims the priority of German Patent Applications 10 2004 047 680.2 filed Sep. 30, 2004 and 10 2004 050 371.0, filed Oct 15, 2004, the disclosure content of which is hereby incorporated by reference.

FIELD OF THE INVENTION

The invention relates to an optoelectronic component that emits radiation in a main radiation direction, a method for producing such an optoelectronic component and an illumination device that contains such an optoelectronic component.

BACKGROUND OF THE INVENTION

Optoelectronic components of the aforementioned type, such as light-emitting diodes (LEDs), for example, generally have two opposite contact areas, the first contact area often being mounted onto an electrically conductive carrier, for example onto a region of a chip housing that is provided with a metallization layer.

The electrical contact-connection of the opposite second contact area of a semiconductor chip usually turns out to be more difficult since it generally does not adjoin the carrier body's second connection region provided. This second contact-connection is conventionally produced by means of a bonding wire. In order to produce an electrically conductive connection between the bonding wire and the chip surface to be contact-connected, a region of the chip surface is provided with a metallic layer, the so-called bonding pad. This metal layer has the disadvantage, however, that it is optically non-transparent and a portion of the light generated in the chip is thereby absorbed. However, a reduction of the area of the bonding pad technically possible only to a limited extent and increases the production outlay.

In order to decrease the problem of the shading of part of the surface of an optoelectronic component that is provided for the coupling out of radiation, it is known from JP 09283801 A for an electrode arranged on the surface of the semiconductor chip to be contact-connected in a wire-free manner by means of an electrically conductive transparent layer composed of indium tin oxide (ITO). In this case, the lateral flanks of the semiconductor chip are electrically insulated from the conductive transparent layer by an insulating layer made of SiO2.

It is known from U.S. Pat. No. 6,066,861 A for an optoelectronic semiconductor chip that is contact-connected by means of a bonding wire in a conventional manner to be embedded into a potting composition containing luminescence conversion substances in order to convert at least a portion of the radiation emitted by the semiconductor chip toward longer wavelengths. In this way, mixed-color or white light can be generated for example with a semiconductor chip that emits blue or ultraviolet light.

SUMMARY OF THE INVENTION

One object of the invention is to provide an improved optoelectronic component comprising a wire-free contact-connection in which the semiconductor chip is protected against ambient influences, there is the possibility for wavelength conversion of the emitted radiation, and the production outlay is comparatively low. Another object is to provide an advantageous method for producing an optoelectronic component of this type.

These and other objects are attained in accordance with one aspect of the invention directed to an optoelectronic component which emits radiation in a main radiation direction, comprising a semiconductor chip having a first main area, a first contact area, and a second main area opposite the first main area with a second contact area, and also comprising a carrier body having two connection regions electrically insulated from one another, the semiconductor chip being fixed by the first main area on the carrier body and the first contact area being electrically conductively connected to the first connection region, the semiconductor chip and the carrier body are provided with a transparent, electrically insulating encapsulation layer. In this case, the radiation emitted in the main radiation direction is coupled out through the encapsulation layer. Furthermore, an electrically conductive layer is led from the second contact area over a partial region of the encapsulation layer to the second electrical connection region of the carrier body, and electrically conductively connects the second contact area to the second connection region.

The electrically insulating encapsulation layer advantageously fulfills a plurality of functions. Since the encapsulation layer is electrically insulating, it prevents a short circuit from arising through the applied electrically conductive layer. This would be the case, for example, if a pn junction of the semiconductor chip was short-circuited by the application of the electrically conductive layer at the lateral flank of the semiconductor chip or the two connection regions of the carrier body were connected to one another by the electrically conductive layer. Furthermore, the encapsulation layer protects the semiconductor chip from ambient influences, in particular from dirt and moisture.

Since the radiation emitted in the main radiation direction by the optoelectronic component is coupled out through the encapsulation layer, the encapsulation layer may advantageously also contain a luminescence conversion material in order to generate white light for example with a semiconductor chip emitting ultraviolet or blue radiation. Suitable luminescence conversion materials, such as, for example, YAG:Ce ($Y_3Al_5O_{12}$:Ce3+), are known from the above-mentioned U.S. Pat. No. 6,066,861 A, the content of which is hereby incorporated by reference. With regard to the efficiency of the luminescence conversion it is particularly advantageous if the encapsulation layer directly adjoins that surface of the semiconductor chip which is provided for the coupling-out of radiation.

The optoelectronic component preferably contains a radiation-emitting semiconductor chip composed of a III-V compound semiconductor material, in particular composed of a nitride compound semiconductor material.

The encapsulation layer is a plastic layer, for example. It is preferably a silicone layer since silicone is distinguished by a high radiation resistance, in particular toward UV light.

The encapsulation layer is particularly preferably a glass layer. An encapsulation layer composed of a glass has the advantage that a glass has a coefficient of thermal expansion that is generally better adapted to the semiconductor chip than in the case of a plastic. Temperature-dictated mechanical stresses that might lead to cracks in the encapsulation layer or even to a detachment of the encapsulation layer are advantageously reduced as a result. A detachment of the electrically conductive layer from the encapsulation layer caused by thermal stresses is likewise avoided. Furthermore, a glass is distinguished by lower absorption of moisture in comparison with a plastic. Furthermore, the resistance to ultraviolet radiation is also very high in the case of an encapsulation layer composed of a glass.

The first main area of the semiconductor chip may simultaneously be the first contact area, and the semiconductor chip may be fixed on the first connection region of the carrier body at said contact area. By way of example, the first contact area of the semiconductor chip may be the rear side of a substrate, which is preferably provided with a metallization, and the electrical connection to the first connection region of the carrier body may be effected by means of a soldering connection or an electrically conductive adhesive.

As an alternative, however, it is also possible for both the first and the second contact area to be situated on the second main area of the semiconductor chip and for both contact areas, with electrically conductive layers insulated from one another, to be connected to a respective one of the two connection regions of the carrier body. This is advantageous in the case of semiconductor chips containing an insulating substrate, for example a sapphire substrate. Insulating sapphire substrates are often used for example in the case of semiconductor chips based on nitride compound semiconductors.

The electrically conductive layer is a patterned metal layer, for example. Said metal layer is preferably patterned in such a way that it covers only a small portion of the second main area of the semiconductor chip, in order to reduce an absorption of the radiation emitted by the optoelectronic component in the metal layer. The patterning of the metal layer may be effected by means of photolithography, by way of example.

The electrically conductive layer is particularly preferably a layer that is transparent to the emitted radiation. This is advantageous in particular for reducing the production outlay, since the transparent layer does not have to be removed from the regions of the insulating layer which are provided for coupling out radiation, and, consequently, no patterning is necessary. The electrically conductive layer may contain for example a transparent conductive oxide (TCO), in particular indium tin oxide (ITO).

If a potential-free surface of the optoelectronic component is desirable, an insulating cover layer, for example a resist layer, is advantageously applied to the electrically conductive layer.

Another aspect of the invention is directed to a method for producing an optoelectronic component which emits radiation in a main radiation direction, comprising a semiconductor chip having a first main area, a first contact area and a second main area opposite the first main area with a second contact area, and also comprising a carrier body having two connection regions electrically insulated from one another, the semiconductor chip is mounted by the first main area onto the carrier body, afterward a transparent insulating encapsulation layer is applied to the semiconductor chip and the carrier body, a first cutout is produced in the encapsulation layer for at least partly uncovering the second contact area of the semiconductor chip and a second cutout is produced in the encapsulation layer for at least partly uncovering the second connection region of the carrier body. Afterward, an electrically conductive layer is applied for producing an electrically conductive connection between the second contact area of the semiconductor chip and the second connection region of the carrier body.

The encapsulation layer is preferably a plastic layer. This layer may be applied for example by laminating on a plastic film, by printing on or spraying on a polymer solution.

In a particularly preferred variant of the method according to the invention, firstly a precursor layer is applied to the semiconductor chip and the carrier body, for example by means of a sol-gel method, by vapor deposition or by spin-coating of a suspension. The organic constituents of the precursor layer are subsequently removed by means of a first thermal treatment. The resultant layer is subsequently densified by means of a second thermal treatment in order to produce an encapsulation layer in the form of a glass layer.

The first and second cutouts in the encapsulation layer are preferably produced by the removal of the encapsulation layer in these regions by means of laser irradiation.

The electrically conductive layer is advantageously applied by a PVD method, for example by means of sputtering, and subsequently reinforced by means of electrodeposition.

As an alternative, the electrically conductive layer may also be applied by a printing method, in particular by a screen printing method. Furthermore, the electrically conductive layer may also be produced by a spraying on or spin-coating method.

An optoelectronic component according to the invention is particularly advantageously suitable for use in illumination devices, in particular in high-power illumination devices such as headlights, for example. In this case, the optoelectronic component or the illumination device, in accordance with one expedient embodiment, has a multiplicity of semiconductor chips. In particular, the optoelectronic component may be used in a front headlight of a motor vehicle or as a light source in projections applications, for example in image and/or video projectors.

The illumination device advantageously has at least one optical element. Preferably, each semiconductor chip of the optoelectronic component is assigned at least one optical element. The optical element serves for forming a beam cone having a highest possible beam intensity and a least possible divergence.

Preferably, an optical element is assigned jointly to a plurality of semiconductor chips. This has the advantage, for example, of simplified mounting compared with the case where each semiconductor chip is assigned a dedicated optical element. In addition or as an alternative, the semiconductor chips are subdivided into at least two groups which are each assigned a dedicated optical element. It goes without saying that it is also possible for each semiconductor chip to be assigned a dedicated optical element. It is also possible for the component or the illumination device to have a single semiconductor chip which is assigned a single optical element.

The optical element is preferably formed in the manner of a non-imaging optical concentrator which, compared with a customary use of a concentrator, is provided for radiation transmission in the opposite direction. The divergence of the light emitted by the light source can advantageously be reduced in an efficient manner through the use of at least one optical element of this type.

In this case, it is particularly advantageous if a light entrance of the optical concentrator is positioned as close as possible to the semiconductor chips, which is advantageously possible particularly well with the wire-free contact-connection specified since the latter, compared with a contact-connection by means of a bonding wire, can be formed with a particularly small height. The solid angle at which the light is emitted from the optical element is expediently reduced by means of the optical element as close as possible to the semiconductor chips, where a cross-sectional area of the beam cone is still small. This is necessary in particular when a highest possible radiation intensity is to be projected onto a smallest possible area, as is the case in headlight applications or projection devices.

An important conservation quantity in geometrical optics is the etendue, that is to say the light conductance. It is the product of the area of a light source and the solid angle at which is effects emission. The entendue describes the extent of a light cone of arbitrary intensity. The conservation of the entendue has the consequence, inter alia, that the light from a diffuse radiation source, for example a semiconductor chip, can no longer be concentrated, that is to say can no longer be deflected onto an area having a smaller extent, without accepting losses, for which reason it is advantageous if the light bundle enters into the optical element with a smallest possible cross section. It is precisely this which is made possible by the specified contact-connection in a particularly advantageous manner.

In a particularly expedient embodiment, the light is greatly collimated by means of the optical element, that is to say the divergence of the light is greatly reduced, in such a way that it is emitted from the optical element in a beam cone with an aperture angle which is less than or equal to 25°, preferably less than or equal to 20°, particularly preferably less than or equal to 15°.

The optical concentrator is advantageously a CPC-, CEC- or CHC-like optical concentrator, which here and hereinafter means a concentrator whose reflective side walls at least partly and/or at least to the greatest possible extent have the form of a compound parabolic concentrator (CPC), a compound elliptic concentrator (CEC) and/or a compound hyperbolic concentrator (CHC).

The reflective surfaces of the optical element are particularly advantageously formed partly or completely as free-form surfaces in order to optimally set a desired emission characteristic. In terms of its basic form, the optical element is in this case preferably similar to a CPC, a CEC or a CHC.

As an alternative, the concentrator advantageously has side walls which connect a radiation entrance to a radiation exit and are formed in such a way that direct connecting lines running on the side walls between the radiation entrance and the radiation exit run essentially straight.

The optical element is advantageously formed in the manner of a dielectric concentrator and has a basic body in the form of a solid body with a dielectric material having a suitable refractive index, so that light coupled into the optical element is reflected by total reflection at lateral interfaces of the solid body with respect to the surrounding medium. By utilizing total reflection, absorption of the light during the reflection thereof can be avoided to the greatest possible extent.

The optical element advantageously has a radiation exit with an interface curved in lens-like fashion. A more extensive reduction of the divergence of the light can be obtained as a result.

Expediently, a portion of adjacent semiconductor chips or all adjacent semiconductors are arranged at a smallest possible distance from one another. The distance is preferably less than or equal to 300 μm, particularly preferably less than or equal to 100 μm, and is greater than or equal to 0 μm. This measure is advantageous for obtaining a highest possible radiance. At the same time, in the case of semiconductor chips arranged so densely, their electrical contact-connection by means of bonding wires may be disadvantageous, whereas the wire-free contact-connection specified is particularly advantageous for the electrical contact-connection of chips arranged close together.

BRIEF DESCRIPTION OF THE DRAWINGS

The invention is explained in more detail below on the basis of exemplary embodiments in conjunction with FIGS. 1 to 8.

FIG. 7 shows a schematic sectional view of part of a fourth exemplary embodiment of the illumination device, and FIG. 8 shows a schematic sectional view of part of a fifth exemplary embodiment of the illumination device.

DETAILED DESCRIPTION OF THE DRAWINGS

Identical or identically acting elements are provided with the same reference symbols in the figures.

Figure 1:
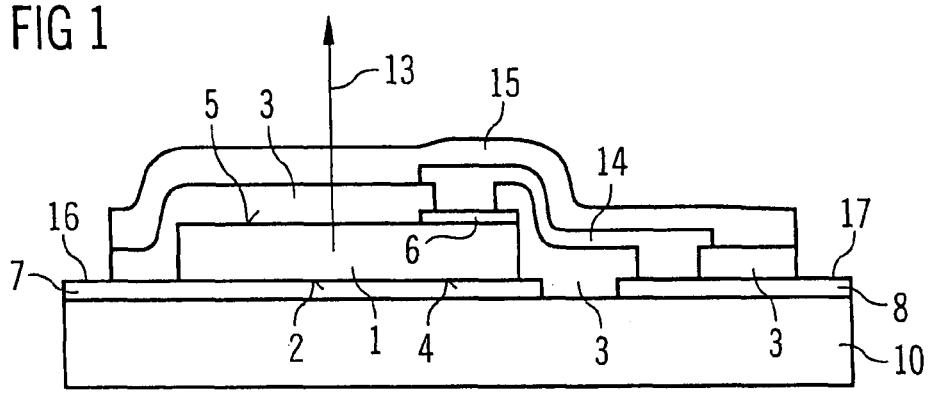
FIG. 1 shows a schematic illustration of a cross section through a first exemplary embodiment of an optoelectronic component according to the invention.
Figure 9:
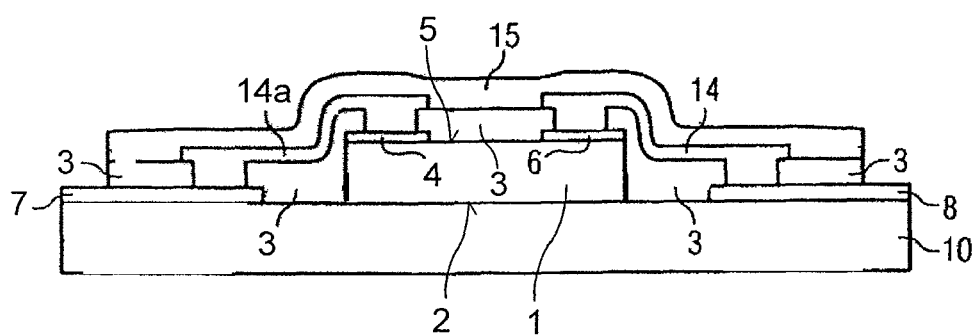
FIG. 9 shows a schematic illustration of a cross section through another exemplary embodiment of an optoelectronic component.

The first exemplary embodiment of an optoelectronic component according to the invention as illustrated in FIG. 1 contains a carrier body 10, to which are applied two contact metallizations, which form a first connection region 7 and a second connection region 8. A semiconductor chip 1 is mounted by a first main area 2, which simultaneously constitutes the first contact area 4 in this exemplary embodiment, onto the first connection region 7. The semiconductor chip 1 is mounted onto the first connection region 7, for example by soldering or adhesive bonding. The semiconductor chip 1 has a second contact area 6 at a second main area 5 of the semiconductor chip 1, said second main area being opposite the first main area 2. As an alternative, however, it is also possible for both the first and the second contact areas 4 and 5 to be situated on the second main area of the semiconductor chip 1 and for both contact areas, with electrically conductive layers insulated from one another, to be connected to a respective one of the two connection regions of the carrier body 10, as shown in FIG. 9.

The semiconductor chip 1 and the carrier body 10 are provided with an encapsulation layer 3. The encapsulation layer 3 is preferably a plastic layer. In particular, a silicone layer may be involved since a silicone layer is distinguished by a particularly good radiation resistance. The encapsulation layer 3 is particularly preferably a glass layer.

The second contact area 6 and the second connection region 8 are connected to one another by an electrically conductive layer 14 led over a partial region of the encapsulation layer 3. The electrically conductive layer 14 contains for example a metal or an electrically conductive transparent oxide (TCO), for example indium tin oxide (ITO), ZnO:Al or SnO:Sb.

In order to obtain a potential-free surface, an insulating cover layer 15, for example a resist layer, is advantageously applied to the electrically conductive layer 14. In the case of a transparent insulating cover layer 15, the latter advantageously need not be patterned and can therefore be applied to the optoelectronic component over the whole area. Partial regions 16, 17 of the connection areas 7, 8 are advantageously kept uncovered by the encapsulation layer 3 and the cover layer 15, so that electrical connections for the power supply of the optoelectronic component can be fitted in these uncovered partial regions 16, 17.

The encapsulation layer 3 protects the semiconductor chip 1 against ambient influences, in particular against dirt or moisture. The encapsulation layer 3 furthermore functions as an insulating carrier of the electrically conductive layer 14, which carrier prevents a short circuit of the lateral flank of the semiconductor chip 1 and/or of the two connection areas 7 or 8 of the carrier body.

In addition, the radiation emitted in a main radiation direction 13 by the semiconductor chip 1 is also coupled out from the optoelectronic component through the encapsulation layer 3. This has the advantage that a luminescence conversion material can be added to the encapsulation layer 3, said material shifting the wavelength of at least one portion of the emitted radiation toward longer wavelengths. In particular, white light can be generated in this way by virtue of the radiation generated by a semiconductor chip 1 that emits in the blue or ultraviolet spectral range being partly converted into the complementary yellow spectral range. A semiconductor chip 1 comprising a radiation-generating active zone containing a nitride compound semiconductor material such as, for example, GaN, AlGaN, InGaN or InGaAlN is preferably used for this purpose.

An exemplary embodiment of a method according to the invention is explained in more detail below on the basis of schematically illustrated intermediate steps with reference to FIGS. 2A to 2F.

Figure 2A:
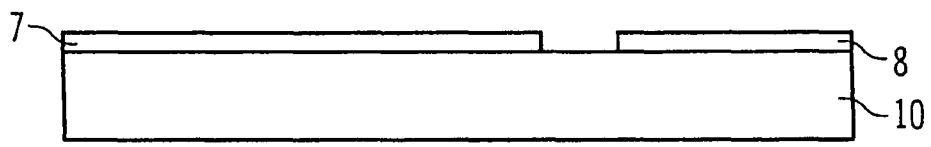
FIGS. 2A to 2F show a schematic illustration of a first exemplary embodiment of a method according to the invention depicted as intermediate steps.

FIG. 2A shows a carrier body 10, on which two connection regions 7, 8 electrically insulated from one another are formed, for example by application and patterning of a metallization layer.

Figure 2B:
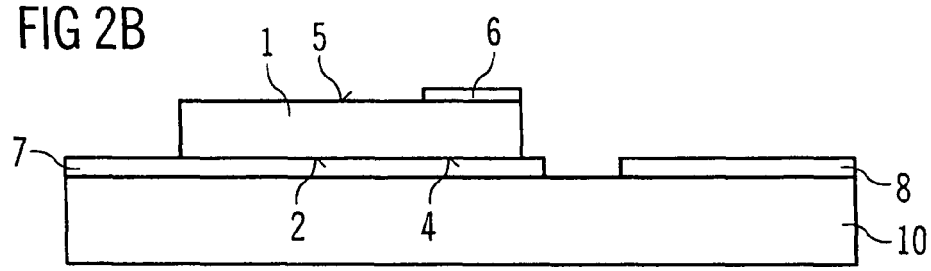

In the case of the intermediate step illustrated in FIG. 2B, a semiconductor chip 1 having a first main area 2 and second main area 5 is mounted by a first contact area 4, which is identical to the second main area 2 of the semiconductor chip 1 in this exemplary embodiment onto the first connection region 7 of the carrier body 10. The semiconductor chip 1 is mounted onto the carrier body 10 for example by means of a soldering connection or an electrically conductive adhesive. The semiconductor chip 1 has a second contact area 6 at the second main area 5, said second contact area being formed for example from a contact layer or contact layer sequence which is applied to the second main area 5 and is patterned by means of photolithography, for example.

Figure 2C:
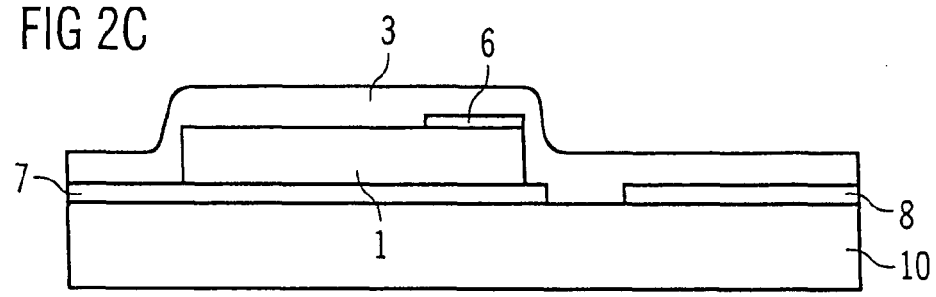

FIG. 2C illustrates an intermediate step in which an encapsulation layer 3 is applied to the semiconductor chip 1 and the carrier body 10 provided with the connection regions 7, 8. The encapsulation layer 3 is preferably applied by spraying on or spin-coating of a polymer solution. Furthermore, a printing method, in particular screen printing, is also advantageous for the application of the encapsulation layer 3.

Figure 2D:
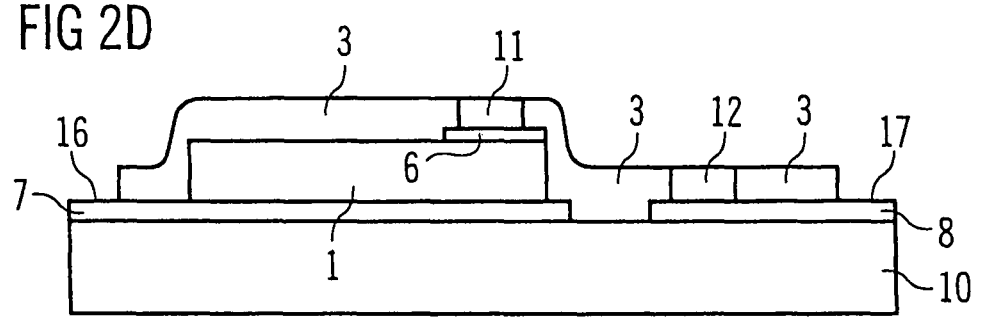

In the case of the method step illustrated in FIG. 2D, a first cutout 11, through which a partial region of the second contact area 6 is uncovered, and a second cutout 12 through which a partial region of the second connection region 8 of the carrier body 10 is uncovered, are produced in the encapsulation layer 3. The cutouts 11, 12 are preferably produced by laser machining. A partial region 16 of the first connection region 7 and a partial region 17 of the second connection region 8 are advantageously uncovered, too, in order to enable the fitting of electrical connections at the carrier body 10 of the optoelectronic component.

Figure 2E:
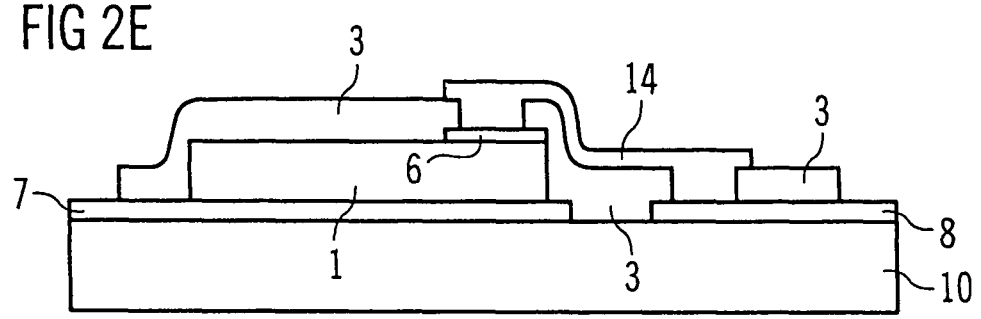

In the case of the intermediate step illustrated in FIG. 2E, the second contact area 6 uncovered beforehand through the cutout 11 is electrically conductively connected, by means of an electrically conductive layer 14, to that region of the second connection area 8 that was uncovered beforehand through the cutout 12.

The electrically conductive layer 14 is a metal layer, for example. This layer is applied for example in such a way that firstly a comparatively thin metal layer, having a thickness of approximately 100 nm, for example, is applied to the encapsulation layer 3 over the whole area. This may be done by vapor deposition or sputtering, for example. A photoresist layer (not illustrated) is subsequently applied to the metal layer, in which a cutout is produced by means of phototechnology in the region in which the electrically conductive layer 14 is intended to connect the second contact area 6 to the second connection region 8.

In the region of the cutout in the photoresist layer, the previously applied metal layer is reinforced by an electrodeposition. This is advantageously effected in such a way that the metal layer in the galvanically reinforced region is significantly thicker than the metal layer previously applied over the whole area. By way of example, the thickness of the metal layer in the galvanically reinforced region may be several (m. The photoresist layer is subsequently removed and an etching process is carried out, by means of which the metal layer is completely removed in the region that has not been galvanically reinforced. In the galvenically reinforced region, by contrast, on account of its greater thickness the metal layer is removed only in part, with the result that it remains as electrically conductive layer 14 in this region.

As an alternative, it is also possible for the electrically conductive layer 14 to be applied to the encapsulation layer 3 directly in patterned form. This may be effected for example by means of a printing method, in particular by means of a screen printing method.

A patterning or a patterned application of the electrically conductive layer 14 is advantageously not required if an electrically conductive layer 14 that is transparent to the emitted radiation is applied. In particular a transparent conductive oxide (TCO), preferably indium tin oxide (ITO) or alternatively an electrically conductive plastic layer is suitable as the electrically conductive transparent layer. The electrically conductive transparent layer is preferably applied by vapor deposition, printing on, spraying on or spin-coating.

Figure 2F:
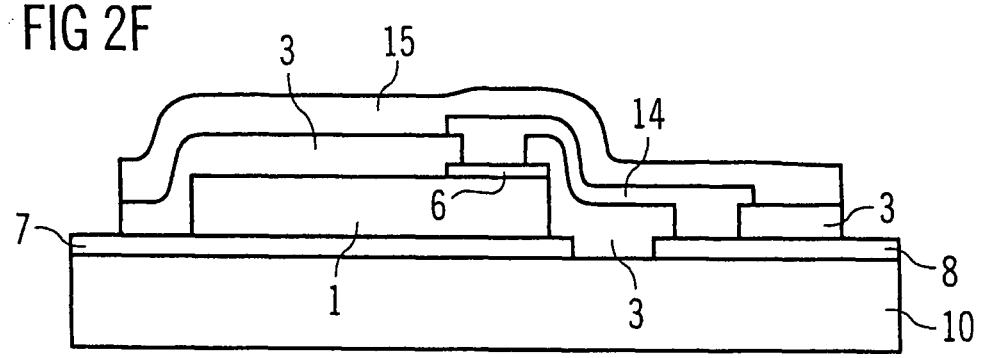

In the case of the method step illustrated in FIG. 2F, an electrically insulating cover layer 15 is applied. The insulating cover layer 15 is preferably a plastic layer, for example a resist layer. The insulating cover layer 15 covers in particular the electrically conductive layer 14 in order to produce a potential-free surface.

An alternative variant of the application of the encapsulation layer 3, that is to say of the intermediate step illustrated previously in FIG. 2C, is explained below with reference to FIGS. 3A, 3B and 3C.

In this case, firstly a precursor layer 9 containing both organic and inorganic constituents is applied to the semiconductor chip 1 and the carrier body 10.

The precursor layer is applied for example by means of a sol-gel method, by vapor deposition, sputtering, spraying on or by spin-coating of a suspension.

Figure 3A:
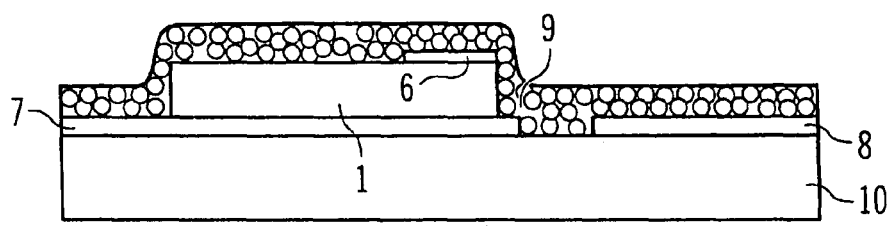
FIGS. 3A to 3C show a schematic illustration of a variant of the application of the encapsulation layer and/or the cover layer in a second exemplary embodiment of a method according to the invention depicted as intermediate steps.
Figure 3B:
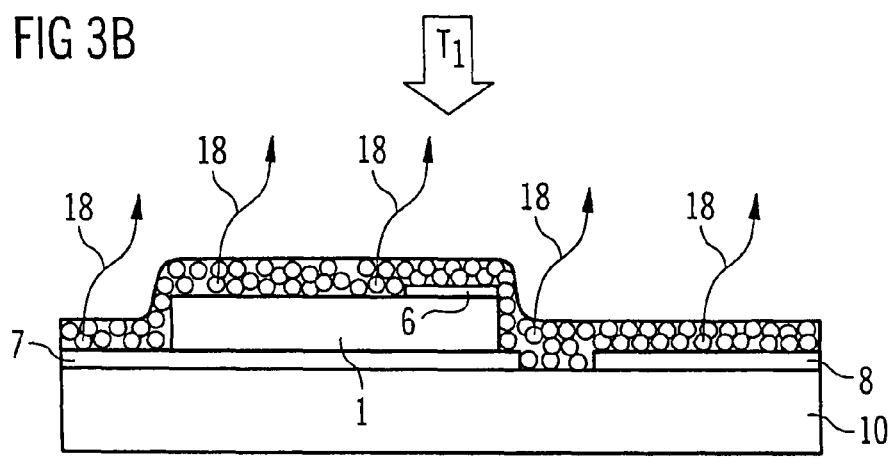

By means of a thermal treatment at a temperature T1 of preferably approximately 200° C. to 400° C. for approximately 4 h to 8 h in a neutral N2 atmosphere or under low O2 partial pressure, the organic constituents of the precursor layer 9 are removed, as indicated by the arrows 18 in FIG. 3B.

The resultant layer is subsequently densified by means of a sintering process, as is illustrated schematically in FIG. 3C, in order to produce the encapsulation layer 3. The sintering is effected by means of a further thermal treatment at a temperature T2 of preferably approximately 300° C. to 500° C. for approximately 4 h to 8 h. Depending on the type of glass layer, the sintering is preferably carried out under a reducing or oxidizing atmosphere.

Figure 3C:
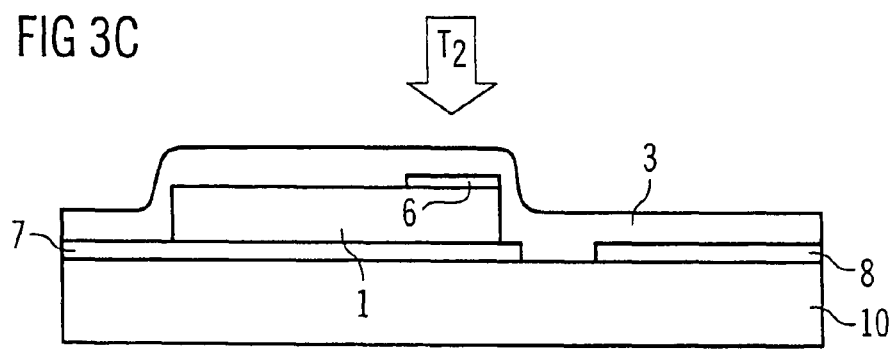

The method steps described in FIGS. 3A, 3B and 3C can analogously also be used for producing a cover layer 15 composed of a glass. In this case, said method steps are preferably carried out a first time in order to produce an encapsulation layer 3 composed of a glass, and are repeated after the application of the electrically conductive layer 14 in order to deposit a cover layer 15 made of a glass.

Through multiple repetition of the application of an electrically insulating layer and an electrically conductive layer, it is also possible to realize multilayer interconnections. This is advantageous in particular for LED modules containing a plurality of semiconductor chips.

FIGS. 4 to 8 illustrate illumination devices comprising at least one optoelectronic component, which in each case have at least one optical element 19, each semiconductor chip 1 of the optoelectronic component being assigned an optical element.

Figure 6:
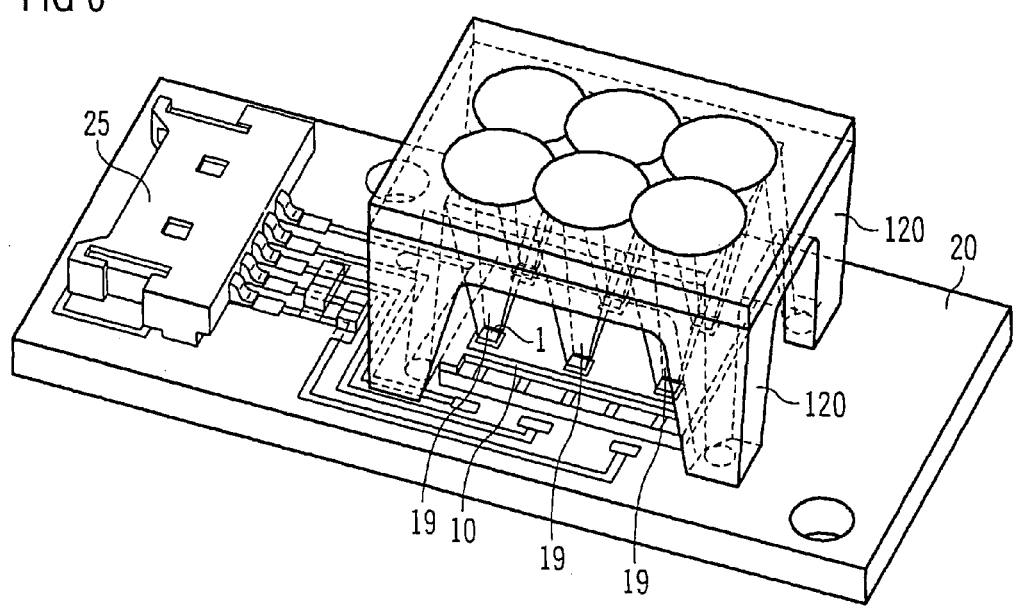
FIG. 6 shows a schematic perspective illustration of a third exemplary embodiment of the illumination device.

In the case of the optoelectronic component illustrated in FIG. 6, a plurality of optical elements 19 are arranged above the semiconductor chips, and are formed integrally with one another, by way of example. By contrast, the optoelectronic component illustrated in FIG. 4 has a single optical element. This optical element 19 is formed in CPC-like fashion.

Each semiconductor chip 1 of the optoelectronic component is assigned to a single optical element 19, for example. A beam entrance of the optical elements that faces the semiconductor chips has a radiation entrance opening whose sides are e.g. (1.5 times a corresponding horizontal edge length of the semiconductor chips, preferably (1.25 times said edge length. If such a small beam entrance is arranged as close as possible to the semiconductor chip, a divergence of the radiation emitted by the semiconductor chips can be effectively reduced and a beam cone having a high luminance can be generated.

Figure 5:
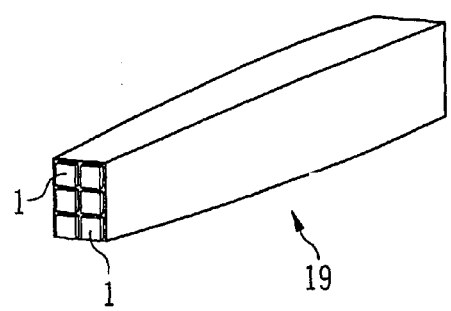
FIG. 5 shows a schematic perspective illustration of a second exemplary embodiment of the illumination device.

Instead of each semiconductor chip being assigned a single dedicated optical element 19, the optical element 19 may also be provided for a plurality of semiconductor chips 1, as is the case for example for the optical element 19 of the component illustrated in FIG. 5. This optical element 19 is also formed in the manner of a CPC. The optical element 19 is provided for six semiconductor chips 1, by way of example.

In order to achieve a highest possible efficiency, the semiconductor chips 1 should be arranged as close together as possible. At least a portion of adjacent semiconductor chips 1 are at a distance of (50 (m from one another, by way of example. Particularly preferably, said semiconductor chips are at substantially no distance from one another.

As an alternative to a CPC-like concentrator, the optical element 19 has for example side walls which run in straight lines from the beam entrance to the beam exit. An example of optical elements 19 of this type is illustrated in FIG. 6. In the case of optical elements 19 of this type, the beam exit is preferably provided with a spherical or aspherical lens or is curved outward in the manner of such a lens.

The advantage of an aspherical curvature, compared with a spherical curvature, is that the aspherical curvature decreases for example as the distance from the optical axis of the optical element 19 increases. This takes account of the circumstance that the beam cone whose divergence is to be reduced by means of the optical element 19 is not a point-type light radiation source, but rather a radiation source having a certain extent.

Such an optical element having reflective walls running straight from the beam entrance to the beam exit has the advantage, compared with a CPC-like optical element, that it can result in a comparable reduction of the divergence of a beam cone in conjunction with a significant reduction of the structural height of the optical element 19. A further advantage of such optical elements is that their straight lateral faces can be produced more simply by means of a molding method such as injection molding or transfer molding, for example, while the formation of curved lateral faces as in the case of CPC-like concentrators is comparatively difficult.

The optical element is preferably a dielectric concentrator with a basic body composed of a dielectric material. As an alternative, however, the use of a concentrator with a basic body that defines a corresponding cavity with reflective inner walls is also possible.

If the optical element 19 is formed in the manner of a dielectric concentrator, additional fixing devices are generally necessary in order to position the optical element 19 on or relative to the semiconductor chips.

Figure 4:
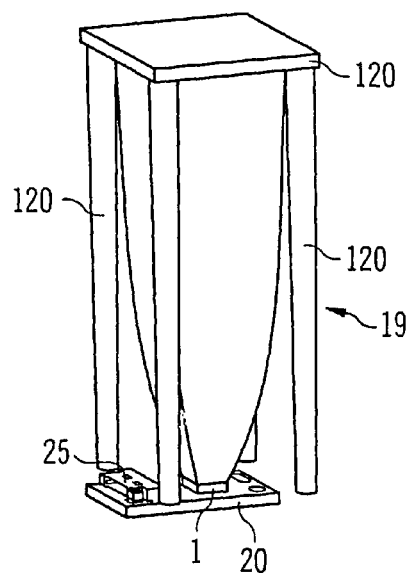
FIG. 4 shows a schematic perspective illustration of a first exemplary embodiment of the illumination device.

The optical elements illustrated in FIGS. 4 and 6 have holding elements 120 which extend in the vicinity of the beam exit of the optical element and, respectively, the optical elements 19 away from the dielectric basic body and project away laterally from the latter and also run at a distance from the basic body in the direction of the beam entrance.

The holding elements 120 may comprise pillar-like elements, for example, on which the optical elements can be set up and therefore positioned relative to the semiconductor chips 1.

As an alternative to holding elements 120 of this type, the optical elements 19 can also be mounted and positioned by means of separate mounting devices. By way of example, they can be inserted into a separate frame.

The components illustrated in FIGS. 4 and 6 are optoelectronic modules having a module carrier 20. There are formed on or in the module carrier electrical conductor tracks and a mating connector 25, via which the module can be electrically connected by means of a corresponding connector.

In the case of the component illustrated in FIG. 7, the optical element 19 is applied on the insulating cover layer 15 directly in such a way that the beam entrance of the optical element 19 adjoins said layer. In this case, the cover layer 15 functions as a coupling material for the optical element. As an alternative, the coupling material may also be applied in the form of an additional layer on the semiconductor chip 1. A "coupling material" should be understood to mean, for example, a dielectric material which is transmissive to the radiation emitted by the semiconductor chips 1 and has a refractive index which preferably corresponds to that of a semiconductor material of the semiconductor chips 1, with the result that Fresnel losses and total reflections at interfaces between the semiconductor chip 1 and the optical element 19 are significantly reduced.

Fresnel losses are losses owing to reflections at interfaces at which there is a sudden change in refractive index. A typical example is the sudden change in refractive index between air and a dielectric material. For example when electromagnetic radiation enters into or emerges from an optical element.

The semiconductor chip 1 is therefore optically coupled to the dielectric basic body of the optical element 19 by means of the coupling material. The coupling material is for example a radiation-transmissive gel having a refractive index which is either adapted to the refractive index of their dielectric body of the optical element 19 or to the refractive index of a semiconductor material of the semiconductor chips 1 or lies between the refractive indices of these two materials. As an alternative to a gel, it is also possible for example to use an epoxy resin or a resist-like material.

The refractive index of the coupling material preferably lies between that of the dielectric body of the optical element 19 and that of a semiconductor material of the semiconductor chips 1. What is essential is that the refractive index is significantly greater than 1. By way of example, a coupling material is used for the coupling medium whose refractive index is greater than 1.3, preferably greater than 1.4. Silicones, for example, are appropriate for this. However, other substances such as e.g. liquids are also possible as coupling medium. Water has, for example, a refractive index of greater than approximately 1.3 and is suitable, in principle, as coupling medium.

In the case of the exemplary embodiment illustrated in FIG. 8, there is a gap 5, for example an air gap between the semiconductor chip 1 and the optical element 19. As an alternative, the gap 5 may also be filled with some other gas and it is likewise possible for a vacuum to prevail in the gap 5. The gap has the effect that a highly divergent portion of the radiation emitted by the semiconductor chip 1, on account of reflections at the interfaces, couples into the optical element 19 to a lesser extent than a low-divergence portion. This may be advantageous for the generation of highly collimated beam cones and also in applications in which a highly divergent portion might be disturbing. One example thereof is projection applications.

In the case of the exemplary embodiment illustrated in FIG. 7, the distance between the beam entrance of the optical element and the semiconductor chip 1 is less than 100 (m, e.g. only approximately 60 (m. In the case of the exemplary embodiment illustrated in FIG. 8, the distance between the beam entrance of the optical element and the semiconductor chip is e.g. 180 (m.

The invention is not restricted by the description on the basis of the exemplary embodiments. Moreover, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic component which emits radiation in a main radiation direction, comprising:

a semiconductor chip having a first main area, a first contact area, and a second main area, opposite the first main area, with a second contact area;

a carrier body having first and second electrical connection regions insulated from one another, the semiconductor chip being fixed by the first main area on the carrier body and the first contact area being electrically conductively connected to the first connection region;

a transparent, electrically insulating encapsulation layer formed on the semiconductor chip and the carrier body, wherein the radiation emitted in the main radiation direction is coupled out through the encapsulation layer, and wherein the encapsulation layer is a glass layer; and a contact connection formed by an electrically conductive layer extending from the second contact area over a region of the encapsulation layer to the second electrical connection region of the carrier body, and electrically conductively connecting the second contact area to the second connection region;

wherein an insulating cover layer is applied to the electrically conductive layer; and wherein the cover layer is a glass layer.

2. The optoelectronic component as claimed in claim 1, wherein the encapsulation layer contains a luminescence conversion material.

3. The optoelectronic component as claimed in claim 1, wherein the first contact area is arranged at the first main area of the semiconductor chip, the semiconductor chip being mounted by the first contact area on the first connection region by means of an electrically conductive connection.

4. The optoelectronic component as claimed in claim 1, wherein the first contact area is arranged at the second main area of the semiconductor chip, and a further electrically conductive layer is led from the first contact area over a partial region of the encapsulation layer to the first electrical connection region of the carrier body, and electrically conductively connects the first contact area to the first connection region.

5. The optoelectronic component as claimed in claim 1, wherein the electrically conductive layer is a layer that is transparent to the emitted radiation.

6. The optoelectronic component as claimed in claim 5, wherein the electrically conductive layer contains a transparent conductive oxide, preferably indium tin oxide.

7. The optoelectronic component as claimed in claim 1, wherein the electrically conductive layer is a patterned metal layer.

8. The optoelectronic component as claimed in claim 1, wherein an insulating cover layer is applied to the electrically conductive layer.

9. The optoelectronic component as claimed in claim 8, wherein the cover layer is a glass layer.

10. An illumination device containing an optoelectronic component as claimed in claim 1.

11. The illumination device as claimed in claim 10, wherein the illumination device is a headlight.

12. The illumination device as claimed in claim 11, wherein the headlight is a front headlight of a motor vehicle.

13. The illumination device as claimed in claim 10, wherein a plurality of semiconductor chips are included and a portion of adjacent semiconductor chips or all adjacent semiconductor chips are at a distance from one another of less than or equal to 300 μm and greater than or equal to 0 μm.

14. The illumination device as claimed in claim 13, wherein a portion of adjacent semiconductor chips or all adjacent semiconductor chips are at a distance of less than or equal to 100 μm and greater than or equal to 0 μm.

* * * * *